United States Patent
Hamada et al.

[11] Patent Number: 5,906,895
[45] Date of Patent: May 25, 1999

[54] THERMAL BARRIER COATING MEMBER AND METHOD OF PRODUCING THE SAME

[75] Inventors: Takahiro Hamada; Masashi Takahashi; Masahiro Saitoh; Yoshiyasu Itoh, all of Yokohama, Japan

[73] Assignee: Kabushiki Kaisha Toshiba, Kawasaki, Japan

[21] Appl. No.: 08/934,344

[22] Filed: Sep. 19, 1997

[30] Foreign Application Priority Data

Sep. 19, 1996 [JP] Japan .................................. 8-248232

[51] Int. Cl.⁶ .............................. B32B 5/14; B32B 15/04; B05D 1/10
[52] U.S. Cl. ........................ 428/610; 428/627; 428/632; 428/633; 427/249; 427/419.2; 427/454; 416/241 B
[58] Field of Search ..................... 428/633, 632, 428/627, 623, 613, 610; 427/405, 419.2, 249, 216, 453, 454, 456; 416/241 B

[56] References Cited

U.S. PATENT DOCUMENTS

| | | | |
|---|---|---|---|
| 4,248,940 | 2/1981 | Goward et al. | 428/633 |
| 4,535,033 | 8/1985 | Stecura | 428/633 |
| 4,576,874 | 3/1986 | Spengler et al. | 428/623 |
| 4,639,388 | 1/1987 | Ainsworth et al. | 428/633 |
| 4,916,022 | 4/1990 | Solfest et al. | 428/623 |
| 5,176,964 | 1/1993 | Marousek et al. | 428/552 |
| 5,185,217 | 2/1993 | Miyamoto et al. | 428/627 |
| 5,384,200 | 1/1995 | Giles et al. | 428/552 |
| 5,512,382 | 4/1996 | Strangman | 428/632 |
| 5,562,998 | 10/1996 | Strangman | 428/612 |
| 5,683,825 | 11/1997 | Bruce et al. | 428/472 |

FOREIGN PATENT DOCUMENTS

| | | |
|---|---|---|
| 0 567 252 | 10/1993 | European Pat. Off. . |
| 0 605 196 | 7/1994 | European Pat. Off. . |
| 2 159 838 | 12/1985 | United Kingdom . |

*Primary Examiner*—John J. Zimmerman
*Attorney, Agent, or Firm*—Oblon, Spivak, McClelland, Maier & Neustadt, P.C.

[57] ABSTRACT

A thermal barrier coating member to be used for such as a member for a gas turbine comprising a metallic member comprising a super alloy mainly composed of at least one of Ni, Co and Fe, an intermediate layer composed of a MCrAlY alloy (M denotes at least one of Ni, Co and Fe) covering this metallic substrate, and a ceramic layer mainly composed of stabilized zirconia formed on the intermediate layer. A ceramic material having a higher melting point than zirconia is compounded in the ceramic layer as a member for suppressing a reaction sintering of the ceramic layer.

13 Claims, 5 Drawing Sheets

5,906,895

THERMAL BARRIER COATING MEMBER AND METHOD OF PRODUCING THE SAME

BACKGROUND OF THE INVENTION

This invention relates to a thermal barrier coating material to be used for high temperature members like moving and stationary blades and combustors of a gas turbine, and a method of producing the same.

Complying with the requirement of effective utilization of energy resources, a research and development directing to make gas turbines highly efficient is aggressively going on in the field thereof. It is known that the higher the temperature of exhaust gas of the combustor is, the efficiency of gas turbine power generators will be higher.

It is therefore recognized to be important attempting to make the inlet temperature of gas turbines high for making gas turbines highly efficient, thus facilitating wide range of research and development to reduce the temperature of materials and improve heat resistance of high temperature members such as moving and stationary blades and combustors of gas turbines.

Countermeasures for reducing the temperature of materials include such constructive improvements as insulating the heat from the combustion gas using a film cooling mechanism, improving cooling characteristics using an impinge cooling mechanism or increasing cooling cross section of moving and stationary blades using a return-flow mechanism.

Countermeasures for improving heat resistance includes various improvements of materials, for example development of high temperature materials using a super alloy of Ni, Co and Fe for the purpose of increasing the strength at high temperature. However, there were some limitations in these high temperature materials that they can be hardly used at a temperature range of 900 to 950 C. where their strength begins to decrease due to softening or recrystallization ascribed to the characteristics of the materials.

For solving this problem, an art using a thermal barrier coating (TBC) has been noted. In TBC method, a thermal barrier ceramic layer of, for example, zirconia having a low thermal conductivity and being chemically stable is coated on a metallic substrate comprising a super alloy.

One example of this thermal barrier coating member has a construction provided with a metallic member (substrate) made of a super alloy mainly composed of Ni, Co or Fe, an intermediate layer covering this substrate and comprising MCrAlY (M denotes at least one of Ni, Co and Fe) being excellent in chemical resistance and anti-oxidation and a ceramic layer mainly composed of a stabilized zirconia on the intermediate layer, wherein temperature increase of the substrate can be suppressed by this ceramic layer. The intermediate layer serves for protecting the metallic substrate as well as enhancing adhesion of the substrate with the ceramic layer.

It is reported in such thermal barrier coating members that the surface temperature of the metallic substrate can be reduced by 50 to 100 C. by a thermal barrier ceramic layer with a thickness of, for example, hundreds microns (for example, Japanese Unexamined Patent Publication No. 62-211387). Accordingly, when this thermal barrier coating member is applied for the high temperature member of a gas turbine, it is possible to increase the driving gas temperature of the gas turbine. Moreover, since heat flux from the combustion gas side to the cooling gas side of the gas turbine can be more reduced, the quantity of cooling gas flow for the metallic member can be also advantageously reduced besides suppressing the temperature increase of the metallic member.

Conventional thermal barrier coating members, however, were so liable to be damaged by cracks or peeling of ceramic layers that their function as a thermal barrier was deteriorated, hence the temperature of the metallic member was increased, thereby sometimes causing troubles that the metallic member was melted or broken at worst. This is by no means preferable in operating the turbine system.

For preventing such troubles from occurring, a number of countermeasures are proposed directing to the causes of cracks and peeling of the ceramic layer, for example difference of thermal expansion between the metallic substrate and ceramic layer, or oxidation and corrosion of the intermediate layer.

Regarding to the countermeasure for the difference of thermal expansion, a method of reducing thermal strain is proposed, wherein, for example, residual stress caused by compression is impressed to the ceramic layer having low thermal expansion coefficient by applying a heat treatment after coating a ceramic layer on the metallic substrate. Since the ceramic layer is used in the residual stress field caused by compression, appearance of cracks and peeling due to the difference in thermal expansion described above may be reduced.

As a countermeasure for oxidation and corrosion of the intermediate layer, a method of improving corrosion resistance of the intermediate layer is proposed, wherein, for example, an oxide layer mainly composed of Al is previously formed on the surface of the intermediate layer to suppress oxygen from invading into the intermediate layer. Progress of oxidation and corrosion in the intermediate layer is prevented via the oxide layer in this case, thereby making it possible to alleviate peeling of the ceramic layer caused by oxidation and corrosion.

Besides the trouble causes above, cracks may often appear by a reaction sintering of the surface film of the ceramic layer, the countermeasure for which has been scarcely noted or investigated. The ceramic layer, mainly composed of zirconia ($ZrO_2$) stabilized with $Y_2O_3$, MgO and CaO that have low thermal conductivity and are chemically stable, have a porous structure containing many air cavities by taking reduction of heat conductivity into consideration. Therefore, thermal conductivity may be increased and heat resistance may be deteriorated when this ceramic layer has turned into a dense structure containing less air cavities.

SUMMARY OF THE INVENTION

It is an object of the present invention is to substantially suppress deterioration of thermal barrier performance of a thermal barrier coating member to be used for such as a member for a gas turbine due to a sintering reaction in a ceramic layer.

The above object can be achieved to the present invention by providing a thermal barrier coating member comprising: a metallic member (substrate) comprising a super alloy mainly composed of at least one of Ni, Co and Fe; an intermediate layer covering the metallic member and comprising a MCrAlY alloy (wherein M denotes at least one of Ni, Co and Fe); and a ceramic layer being formed on the metallic member via the intermediate layer and mainly composed of a stabilized zirconia, the ceramic layer including a member for suppressing a reaction sintering in the ceramic layer.

In first aspect, the member is a ceramic material having a higher melting point than zirconia, the ceramic material being compounded in the ceramic layer. This ceramic material enables to suppress deterioration in thermal barrier performance, hence enhancing heat resistance.

The ceramic material described above is preferably composed of at least one of compounds comprising HfC, NbC, SiC, TaC, $Ta_2C$, TiC, WC, ZrC, $HfB_2$, $NbB_2$, $TaB_2$, $TiB_2$, $ZrB_2$, BN, TaN, TiN, ZrN, $HfO_2$ and $ThO_2$.

The ceramic material is preferably contained so as to have a gradient of volume ratio in a direction of thickness of the ceramic layer, the gradient at an outer surface of the ceramic layer being larger than the gradient at a junction face with the intermediate layer. The gradient is preferably a gradient to increase from the junction face to the outer surface gradually and continuously.

In another aspect, the above member is formed by an air cavity injected into the ceramic layer in a controlled manner. The air cavities cited herein are positively injected in a controlled manner, thereby being different from the natural mixing in the conventional manufacturing.

The air cavity is preferably formed in the ceramic layer with a controlled gradient of an air cavity ratio in a direction of thickness of the ceramic layer, the gradient at an outer surface of the ceramic layer being larger than the gradient at a junction face with intermediate layer.

The gradient is more preferably a gradient to increase from the junction face to the outer surface gradually and continuously.

The thermal barrier coating member described above can be produced by the following method.

The method of producing the thermal barrier coating member comprises the steps of; forming a metallic member using a super alloy mainly composed of at least one of Ni, Co and Fe, forming an intermediate layer with a MCrAlY alloy (wherein M denotes at least one of Ni, Co and Fe), and coating the intermediate layer with a ceramic layer mainly composed of a stabilized zirconia, characterized in that a powder material of the stabilized zirconia and a ceramic material having a higher melting point than zirconia are used for the material of the ceramic layer described above.

Followings are the preferred embodiments of the method of producing the thermal barrier coating member:

1) A material prepared by fusing the powder material of stabilized zirconia with the ceramic materials described above using a high temperature heat source is used for the materials of the ceramic layer.

2) A material prepared by mixing the powder material of stabilized zirconia with the ceramic materials described above using a mechanical alloying (MA) method is used for the material of the ceramic layer.

3) A material prepared by coating the powder material of stabilized zirconia with the ceramic materials described above using a chemical vapor deposition method is used for the material of the ceramic layer.

4) The ceramic materials described above is compounded by forming a ceramic layer using the powder material of stabilized zirconia followed by allowing to permeate a feed gas of the ceramic material into the ceramic layer using a chemical vapor deposition method.

A material comprising at least one of the compound comprising HfC, NbC, SiC, TaC, $Ta_2C$, TiC, WC, ZrC, $HfB_2$, $NbB_2$, $TaB_2$, $TiB_2$, $ZrB_2$, BN, TaN, TiN, ZrN, $HfO_2$ and $ThO_2$ is used as a material for the ceramic materials described above.

According to the present invention, as hitherto described, the reaction sintering in the surface film of the ceramic layer is made to be hardly proceed and generation of cracks in the ceramic layer as well as accompanying deterioration of thermal barrier performance is suppressed by the novel member for suppressing the reaction sintering such as the above ceramic material, thereby largely improving heat resistance of the thermal barrier coating member. This effect can be more efficiently exhibited when appropriate gradients are given to the volume ratio of the ceramic material and the ratio of the air cavity in the ceramic layer.

BRIEF DESCRIPTION OF THE DRAWINGS

The accompanying drawing which are incorporated in and constitute a part of this specification, illustrate embodiments of the present invention and, together with the description, serve to explain the principles of the present invention, in which.

DESCRIPTION OF THE PREFERRED EMBODIMENT

Figure 1:
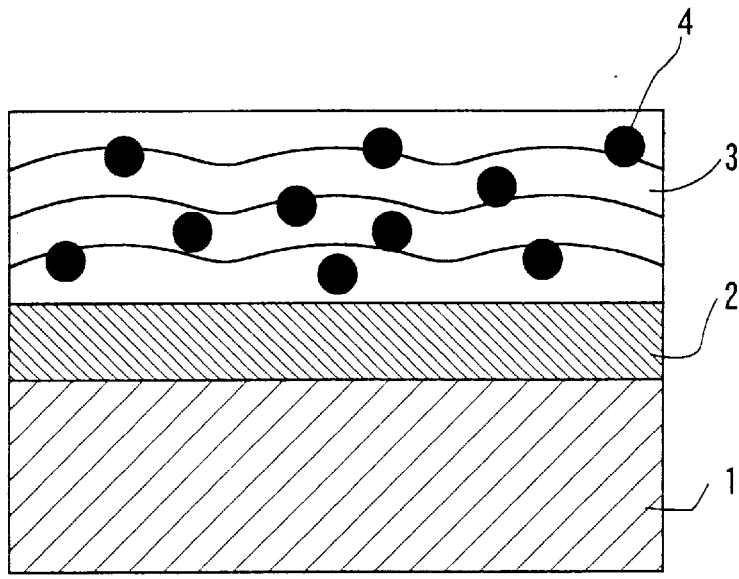
FIG. 1 is a schematic sectional view illustrating a concept of the thermal barrier coating member according to this invention.

The thermal barrier coating member and the method of producing the same according to this invention are described hereinafter referring to the drawings.

The thermal barrier coating member shown in FIG. 1 can be applied, for example, for high temperature members of a gas turbine such as moving and stationary blades and combustors, providing a metallic member (substrate) 1 mainly composed of Ni, Co or Fe, an intermediate layer 2 mainly composed of MCrAlY (wherein M denotes at least one of Ni, Co and Fe) covering the substrate 1 and a ceramic layer 3 mainly composed of stabilized zirconia on the intermediate layer 2. A ceramic material 4 having a higher melting point than zirconia described above is compounded inside of this ceramic layer 3.

Figure 2:
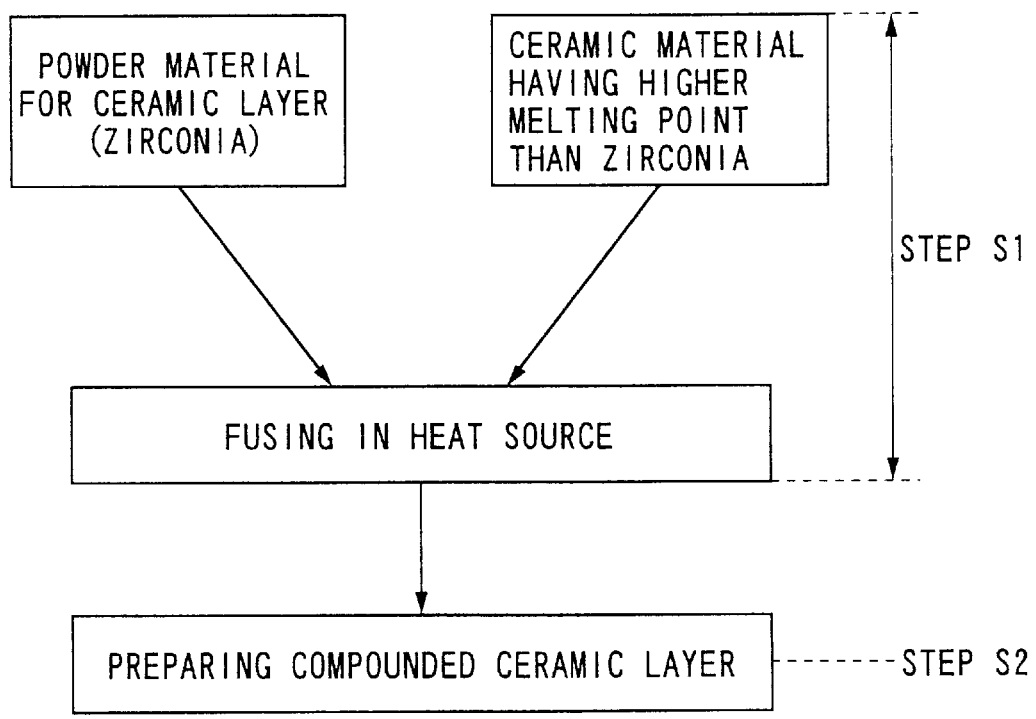
FIG. 2 is a schematic diagram of the production process of the thermal barrier coating member according to this invention.

The method of producing the thermal barrier coating member is described referring to FIG. 2. First, an intermediate layer is formed on the metallic substrate using a conventional coating method. Then, a ceramic coating for forming a ceramic layer is applied on this intermediate layer. In this coating process, a powder material of stabilized zirconia is fused with a ceramic material having a higher melting point than zirconia in a high temperature heat source (plasma) using an atmospheric plasma spray coating method as shown in step S1 in FIG. 2. A ceramic layer is formed in step S2 by compounding the ceramic materials prepared above into a single material.

According to this embodiment, progress of the reaction sintering can be effectively suppressed by the presence of a ceramic material having a higher melting point than zirconia to prevent deterioration of thermal barrier performance caused by cracks, thereby providing a thermal barrier coating member in which heat resistance is greatly improved.

Figure 3:
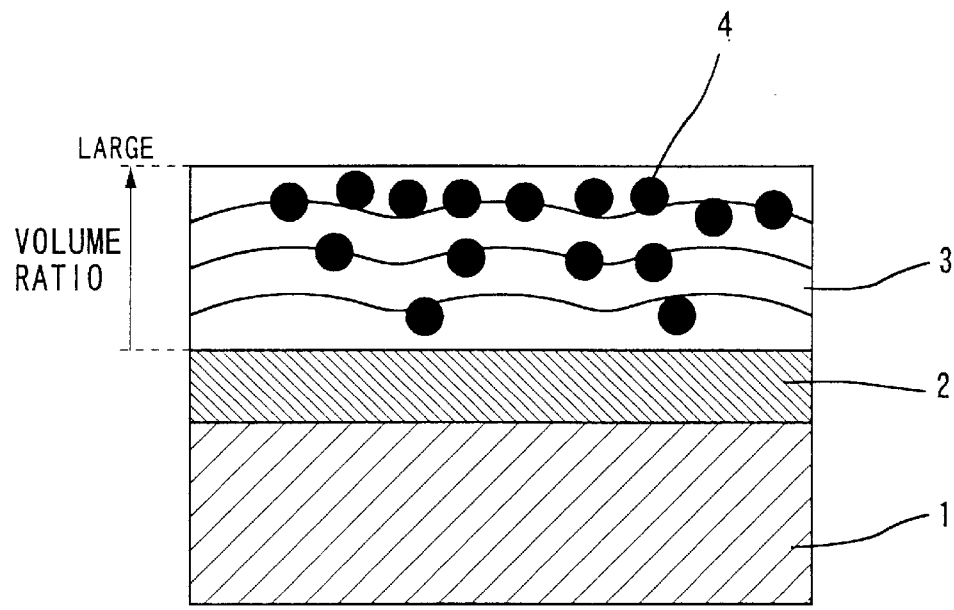
FIG. 3 is a schematic sectional view illustrating the case where the volume ratio of the ceramic material is changed.
Figure 4:
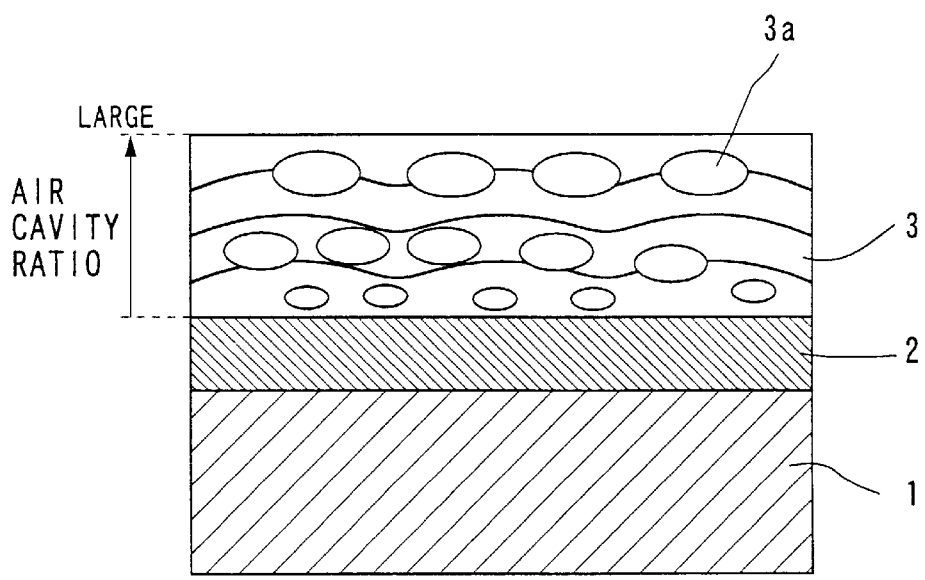
FIG. 4 is a schematic sectional view illustrating the case where the ratio of air cavities is changed.

A modification of the thermal barrier coating member is possible by using the members shown in FIG. 3 or FIG. 4.

In the thermal barrier coating member shown in FIG. 3, the ceramic material 4 is compounded in the ceramic layer 3, wherein the volume ratio of the former has a gradient to increases as approaching to the surface of the ceramic layer. Because the temperature of the ceramic layer 3 becomes higher at the close position to its surface, changing the volume ratio of the ceramic material in accordance with the temperature gradient in the ceramic layer 3 allows progress of the reaction sintering in the ceramic layer 3 to be suppressed as well as making shrinkage ratio accompanied by sintering inside of the ceramic layer 3 constant. Accordingly, deterioration in the thermal barrier performance caused by cracks can be suppressed by effectively suppressing occurrence of cracks inside of the ceramic layer 3 arising from the difference of the shrinkage ratio, thereby more improving the heat resistance of the thermal barrier coating member.

In the thermal barrier coating member shown in FIG. 4, the ceramic layer 3 is formed so that the size of air cavities 3a in the ceramic layer 3 has a gradient to increase along the direction to the surface of the ceramic layer. In this case, progress of sintering reaction in the ceramic layer can be also suppressed by the air cavities 3a in the ceramic layer 3. Forming a gradient in the air cavity ratio in the ceramic layer 3 makes shrinkage ratio accompanied by sintering in the ceramic layer 3 constant, which enables to exhibit identical effects as described above with an additional advantage that a ceramic material having a higher melting point than zirconia is not always required.

Figure 5:
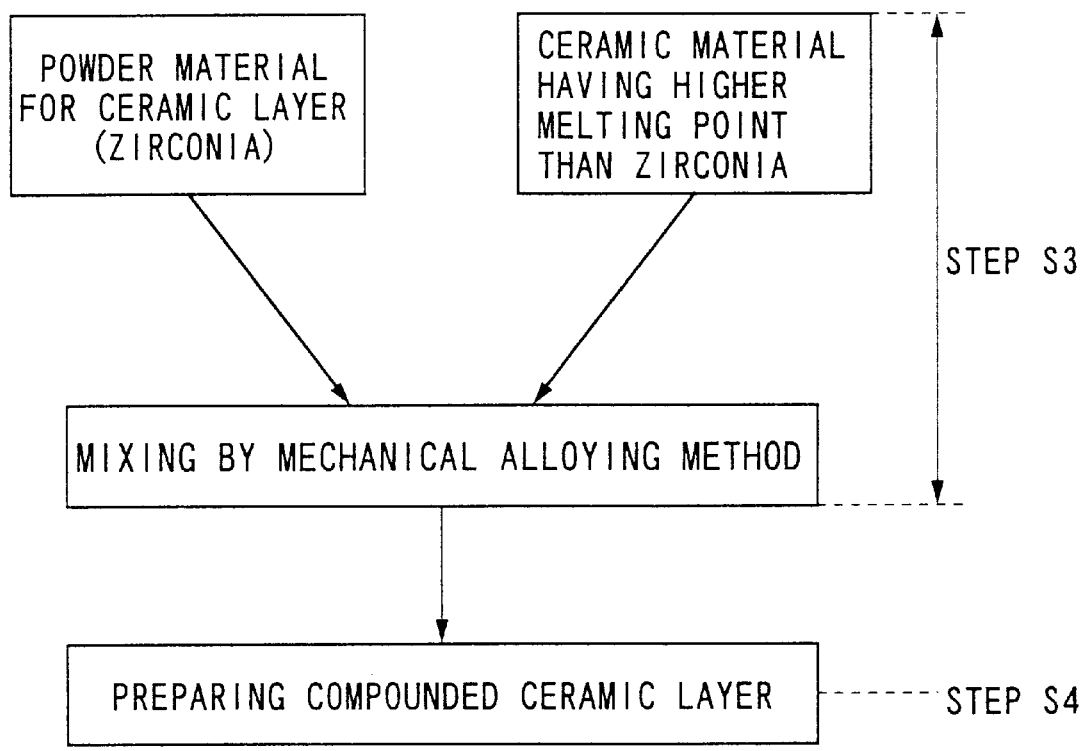
FIG. 5 is a schematic diagram of the production process where a MA method is used.
Figure 6:
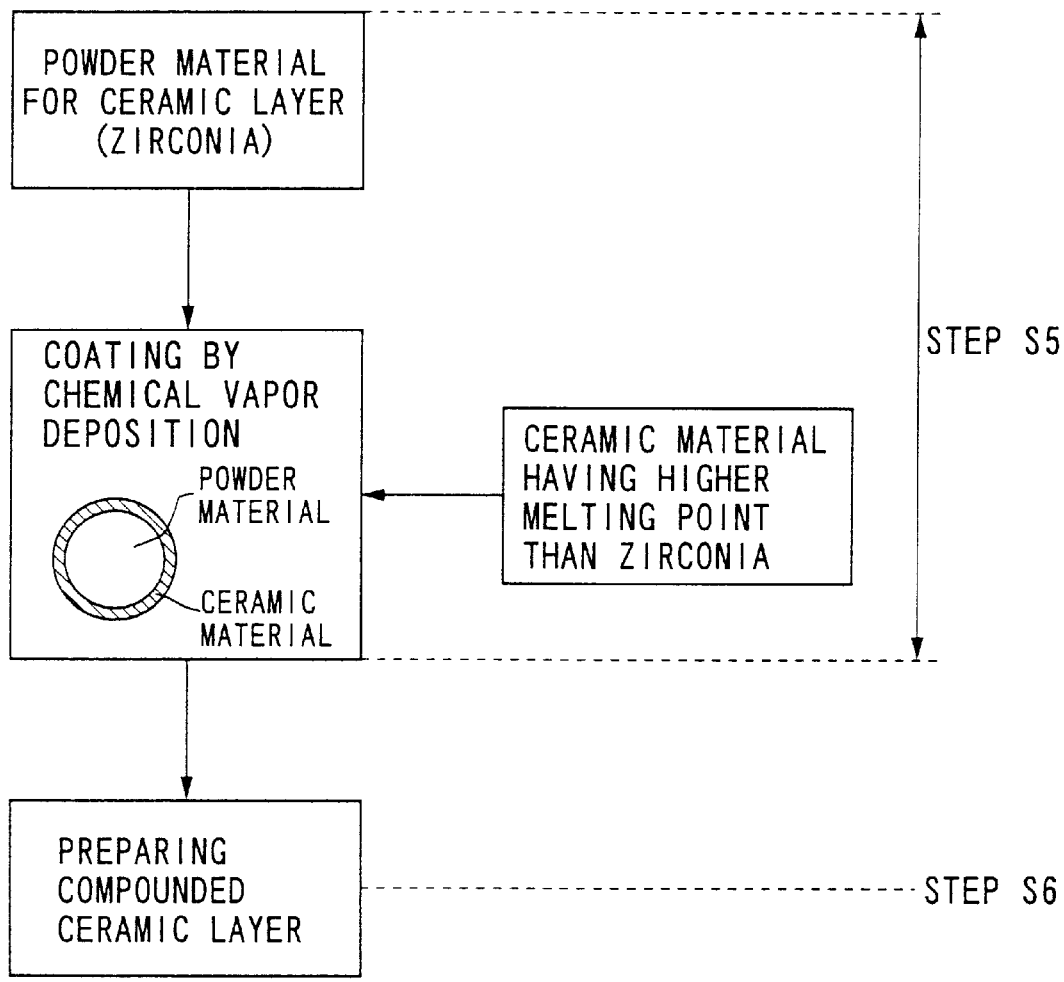
FIG. 6 is a schematic diagram of the production process where the materials are prepared using a chemical vapor deposition method.
Figure 7:
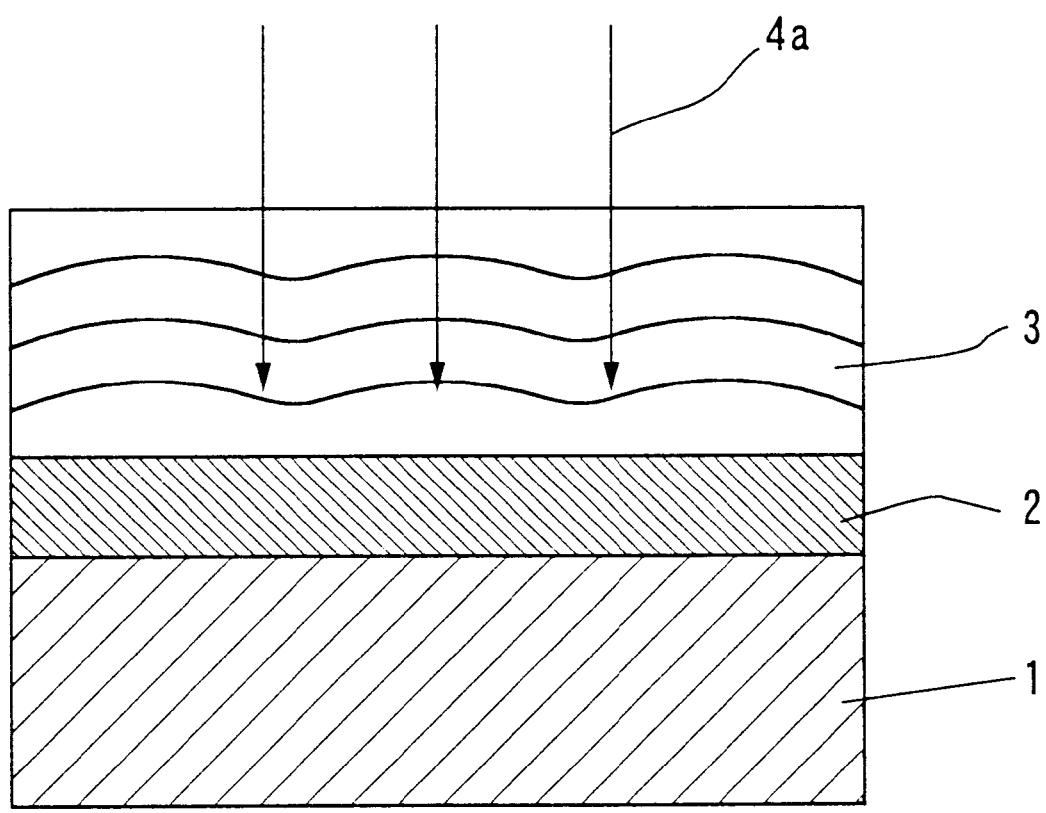
FIG. 7 is a schematic sectional view illustrating the production process where a feed gas of the ceramic materials is used.

The ceramic coating method as shown in FIG. 5 to FIG. 7 may be also used as variations for producing the thermal barrier coating member.

FIG. 5 describes a method of preparing starting materials using a mechanical alloying (MA) method. In this method, a powder material of a stabilized zirconia is mixed with a ceramic material having a higher melting point than zirconia by MA method, followed by forming a ceramic layer by compounding the two kind of ceramic materials above into a single material in step S4. Since the ceramic materials are uniformly dispersed in the whole ceramic layer in this case, progress of the reaction sintering in the ceramic layer can be totally, uniformly and stably suppressed, thereby more effectively suppressing deterioration of thermal barrier performance arising from cracks.

FIG. 6 illustrates the method of producing the thermal barrier coating member when the material is prepared using a chemical vapor deposition (CVD) method. In this method, the powder material of stabilized zirconia is coated with a ceramic material having a higher melting point than zirconia by a chemical vapor deposition method in step S5, followed by forming a ceramic layer in step S6 in which the ceramic materials are compounded in a single material using the powder material described above. Since the ceramic material is uniformly dispersed in the whole ceramic layer, the effect as hitherto described can be exhibited.

FIG. 7 illustrates the method of producing the thermal barrier coating member when the feed gas is permeated into the ceramic layer using a chemical vapor deposition method. This method comprises the steps of coating a ceramic layer 3 mainly composed of stabilized zirconia on the intermediate layer 2 covering the metallic substrate 1 and allowing the feed gas 4a of the ceramic material 4 to permeate into the ceramic layer 3 to coat the layer with the gas, thereby forming a ceramic layer 3 by compounding the ceramic material 4 into a single material. Since the ceramic material can be also uniformly dispersed into the whole ceramic layer, the effect as hitherto described can be exhibited. Moreover, this method has an advantage that it can be applied to a member whose ceramic layer has already been coated.

For the purpose of verifying the characteristic properties of the thermal barrier coating member produced as hitherto described, many kind of test pieces were prepared. The results are listed in table 1.

TABLE 1

| | | | Ceramic layer | | | | | |
| --- | --- | --- | --- | --- | --- | --- | --- | --- |
| | | | | | | Compounded Ceramic material | Air cavity | Result high Temperature |
| Sample No. | Metallic Substrate Type | Intermediate layer Type | Production Condition | Main Component | Type | Volume ratio (%) | Ratio (%) | Oxidation test (μm) |
| Example 1 | HS-188 | NiCoCrAlY | APS | ZrO$_2$ | SiC | 5 | 13 | 3.1 |
| Example 2 | HS-188 | NiCoCrAlY | APS | ZrO$_2$ | SiC | 2→5→8 | 13 | 2.9 |
| Example 3 | HS-188 | NiCoCrAlY | APS | ZrO$_2$ | — | — | 10→16→20 | 3.2 |
| Example 4 | HS-188 | NiCoCrAlY | MA→APS | ZrO$_2$ | SiC | 5 | 13 | 2.4 |
| Example 5 | HS-188 | NiCoCrAlY | CVD→APS | ZrO$_2$ | SiC | 5 | 13 | 2.3 |
| Example 6 | HS-158 | NiCoCrAlY | APS→CVD | ZrO$_2$ | SiC | 5 | 13 | 2.5 |
| Comp. Ex. 1 | HS-188 | NiCoCrAlY | APS | ZrO$_2$ | — | — | 13 | 3.8 |

EXAMPLE 1

A thermal barrier coating member having a ceramic layer mainly composed of stabilized zirconia to which SiC was compounded was produced by an atmospheric plasma spray coating (APS) method using HS-188 (Co super alloy) as a metallic substrate and NiCoCrAlY alloy as an intermediate layer. The production conditions by the plasma spray coating method were a spray distance of 100 mm, a spray speed of 450 mm/sec., a feed speed of powder of 30 g/min., an electric current of 500 A and a voltage of 68 V. As shown in Table 1, the sample piece obtained had an air cavity ratio of 13% and a volume ratio of ceramics of 5%.

EXAMPLE 2

A thermal barrier coating member was produced by the same production conditions as in Example 1, except that the ceramic layer had a gradient in the volume ratio of the ceramic materials. As shown in Table 1, the sample piece obtained had an air cavity ratio of 13% and the volume ratio of the ceramic material showed a step wise change of 2, 5 and 8% along the direction to the surface of the ceramic layer.

EXAMPLE 3

A thermal barrier coating member was produced by the same production conditions as in Example 1, except that the ceramic material was not used but the ceramic layer was made to have a gradient of the air cavity ratio. As shown in Table 1, the air cavity ratio of the sample piece obtained showed a step wise change of 10, 16 and 20% along the direction to the surface of the ceramic layer.

EXAMPLE 4

A thermal barrier coating member was produced by the same production conditions as in Example 1, except that MA method described above was used. As shown in Table 1, the sample piece obtained had an air cavity ratio of 13% and a volume ratio of the ceramic material of 5% in the ceramic layer.

EXAMPLE 5

A thermal barrier coating member was produced by the same production conditions as in Example 1, except that a chemical vapor deposition method was used for preparing the materials. As shown in Table 1, the sample piece obtained had an air cavity ratio of 13% and a volume ratio of the ceramic material of 5% in the ceramic layer.

EXAMPLE 6

A thermal barrier coating member was produced by the same production conditions as in Example 1, except that a feed gas was permeated into the ceramic layer using the chemical vapor deposition method as hitherto described. As shown in Table 1, the sample piece obtained had an air cavity ratio of 13% and a volume ratio of the ceramic material of 5% in the ceramic layer.

COMPARATIVE EXAMPLE 1

A thermal barrier coating member was produced by the same production conditions as in Example 1, except that any ceramic materials were not used. As shown in Table 1, the sample piece obtained had an air cavity ratio of 13% in the ceramic layer.

High temperature oxidation tests in the atmospheric condition were carried out for each sample described above at 850 C. for 2000 hours. The thickness of the oxidized film between the intermediate layer and ceramic layer formed by the high temperature oxidation test was measured as an index for evaluating the performance of the thermal barrier coating member, since the oxidized film formed between the intermediate layer and ceramic layer in the thermal barrier coating member generally becomes a main cause of peeling.

The results indicate that, as shown in table 1, the thickness of the oxidized film is clearly thinner in Examples 1 to 3 than in Comparative Example 1, making it possible to confirm that a thermal barrier coating member having a superior heat resistance to that of the prior art can be provided by compounding the ceramic materials with a gradient in the ceramic layer, or by giving a gradient to the ceramic layer.

The thickness of the oxidized film was more thinner in the case of Examples 4 to 6 than that in the other examples, confirming also that far more superior thermal barrier coating member in heat resistance could be provided by preparing the powder material using MA method and chemical vapor deposition method.

The results were similar with those obtained above where 1) the super alloys hitherto described other than HS-188 were used, 2) MCrAlY (wherein M denotes an alloy of Co, Fe or an alloy thereof with Ni) hitherto described other than NiCoCrAlY was used for the intermediate layer, and 3) a material comprising at least one of the compounds of HfC, NbC, TaC, $Ta_2C$, TiC, WC, ZrC, $HfB_2$, $NbB_2$, $TaB_2$, $TiB_2$, $ZrB_2$, BN, TaN, TiN, ZrN, $HfO_2$ and $ThO_2$ other than SiC, or a mixture thereof with SiC is used for the ceramic material to be compounded into the ceramic layer.

The invention may be embodied on other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A thermal barrier coating member comprising:
   a metallic member comprising a super alloy mainly composed of at least one of Ni, Co and Fe;
   an intermediate layer covering the metallic member and comprising a MCrAlY alloy, wherein M denotes at least one of Ni, Co and Fe; and
   a ceramic layer covering the intermediate layer and mainly composed of a stabilized zirconia, the ceramic layer including a member for suppressing a reaction sintering in the ceramic layer,
   wherein the member is a ceramic material having a higher melting point than zirconia, the ceramic material being dispersed in the ceramic layer so as to have a gradient of a volume ratio of ceramic material to ceramic layer in a direction of thickness of the ceramic layer, the volume ratio at an outer surface of the ceramic layer being larger than the volume ratio at a junction face with the intermediate layer.

2. The thermal barrier coating member according to claim 1, wherein the ceramic material comprises at least one compound selected from the group consisting of HfC, NbC, SiC, TaC, $Ta_2C$, TiC, WC, ZrC, $HfB_2$, $NbB_2$, $TaB_2$, $TiB_2$, $ZrB_2$, BN, TaN, TiN, ZrN, $HfO_2$ and $ThO_2$.

3. The thermal barrier coating member according to claim 1, wherein the volume ratio increases from the junction face to the outer face gradually and continuously.

4. A member for a gas turbine, the member being formed with a thermal barrier coating member as defined in claim 1.

5. A thermal barrier coating member comprising:
   a metallic member comprising a super alloy mainly composed of at least one of Ni, Co and Fe;
   an intermediate layer covering the metallic member and comprising a MCrAlY alloy, wherein M denotes at least one of Ni, Co and Fe; and
   a ceramic layer covering the intermediate layer and mainly composed of a stabilized zirconia comprising $ZrO_2$ to which a material is added, the material acting to stabilize $ZrO_2$ chemically and being in a solid-solution state in $ZrO_2$, the ceramic layer containing air cavities, wherein said air cavities are present so as to have a gradient of an air cavity ratio of air cavity volume to ceramic layer volume in a direction of thickness of the ceramic layer, said air cavity ratio being higher at an outer surface of the ceramic layer than at a junction face with the intermediate layer so as to suppress a reaction sintering in the stabilized zirconia.

6. The thermal barrier coating member according to claim 5, wherein the air cavity ratio increases from the junction face to the outer surface gradually and continuously.

7. A method of producing a thermal barrier coating member comprising the steps of:

forming a metallic member comprising a super alloy mainly composed of at least one of Ni, Co and Fe;

covering the metallic member with an intermediate layer of a MCrAlY alloy, wherein M denotes at least one of Ni, Co and Fe; and coating the intermediate layer with a powder material of a stabilized zirconia and a ceramic material having a higher melting point than zirconia, wherein said coating step comprises the steps of:

coating the powder material with the ceramic material using a chemical vapor deposition method; and coating the intermediate layer using the coated powder material.

8. A method of producing a thermal barrier coating member comprising the steps of:

forming a metallic member comprising a super alloy mainly composed of at least one of Ni, Co and Fe;

covering the metallic member with an intermediate layer of a MCrAlY alloy, wherein M denotes at least one of Ni, Co and Fe; and coating the intermediate layer with a powder material of a stabilized zirconia and a ceramic material having a higher melting point than zirconia, to form a ceramic layer, the ceramic material being dispersed in the ceramic layer so as to have a gradient of a volume ratio of ceramic material to ceramic layer in a direction of thickness of the ceramic layer, the volume ratio at an outer surface of the ceramic layer being larger than the volume ratio at a junction face with the intermediate layer, thereby suppressing a reaction sintering in the ceramic layer.

9. The method of producing a thermal barrier coating member according to claim 8, wherein the coating step comprises the steps of:

fusing the powder material of said stabilized zirconia and the ceramic material with each other using a heat source; and coating the intermediate layer with the fused materials.

10. The method of producing a thermal barrier coating member according to claim 8, wherein the coating step comprises the steps of:

mixing the powder material of said stabilized zirconia with the ceramic material using a mechanical alloying (MA) method; and coating the intermediate layer with the mixed materials.

11. The method of producing a thermal barrier coating member according to claim 8, wherein the coating step comprises the steps of:

coating the powder material of said stabilized zirconia with the ceramic material using a chemical vapor deposition method; and coating the intermediate layer using the coated powder material.

12. The method of producing a thermal barrier coating member according to claim 8, wherein the coating step comprises the steps of:

coating the intermediate layer using the powder material of said stabilized zirconia to form a layer on the intermediate layer; and supplying a feed gas of said ceramic material into the layer using a chemical vapor deposition method so that said feed gas permeates into the layer, thereby forming the ceramic layer.

13. The method of producing a thermal barrier coating member according to any one of claims 7–12, wherein the ceramic material comprises at least one compound selected from the group consisting of HfC, NbC, SiC, TaC, $Ta_2C$, TiC, WC, ZrC, $HfB_2$, $NbB_2$, $TaB_2$, $TiB_2$, $ZrB_2$, BN, TaN, TiN, ZrN, $HfO_2$ and $ThO_2$.

* * * * *